(12) United States Patent
Itai et al.

(10) Patent No.: US 8,516,145 B2
(45) Date of Patent: Aug. 20, 2013

(54) INFORMATION PROCESSING METHOD AND INFORMATION PROCESSING APPARATUS FOR TRANSMITTING DATA GENERATED BY DEVICE MANUFACTURING APPARATUS

(75) Inventors: Daisuke Itai, Yokohama (JP); Hiroaki Fujiwara, Utsunomiya (JP); Mitsuhiro Masuda, Utsunomiya (JP); Kunitaka Ozawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 343 days.

(21) Appl. No.: 12/838,210

(22) Filed: Jul. 16, 2010

(65) Prior Publication Data
US 2011/0029685 A1 Feb. 3, 2011

(30) Foreign Application Priority Data
Jul. 31, 2009 (JP) .................................. 2009-180053

(51) Int. Cl.
*G06F 15/16* (2006.01)
(52) U.S. Cl.
USPC .......................................................... 709/232
(58) Field of Classification Search
USPC ................................................. 709/232–233
See application file for complete search history.

(56) References Cited

U.S. PATENT DOCUMENTS

| | | | |
|---|---|---|---|
| 2002/0083185 A1* | 6/2002 | Ruttenberg et al. | 709/232 |
| 2003/0179755 A1* | 9/2003 | Fraser | 370/395.42 |
| 2005/0091395 A1* | 4/2005 | Harris et al. | 709/232 |
| 2006/0013247 A1* | 1/2006 | Koch et al. | 370/437 |
| 2006/0056297 A1* | 3/2006 | Bryson et al. | 370/230 |
| 2007/0011380 A1* | 1/2007 | Kawai et al. | 710/113 |
| 2008/0016265 A1* | 1/2008 | Oshikiri et al. | 710/309 |

FOREIGN PATENT DOCUMENTS
JP 2001-203247 A 7/2001

* cited by examiner

*Primary Examiner* — Jason Recek
(74) *Attorney, Agent, or Firm* — Canon USA, Inc., IP Division (57) ABSTRACT

An apparatus which transmits data generated by a device manufacturing apparatus to at least one terminal, comprises a communication unit, a transmission request processor configured to accept or reject a transmission request which the communication unit has received from the terminal, and a transmission controller configured to control the communication unit to transmit, in response to a transmission request accepted by the transmission request processor, data corresponding to the transmission request to a terminal, of the at least one terminal, which has transmitted the transmission request, wherein the transmission request processor accepts a new transmission request if a sum of transmission rates of the respective data concurrently transmitted from the communication unit in response to transmission requests which the transmission request processor has already accepted and a transmission rate at which data is transmitted in response to the new transmission request does not exceed a preset allowable transmission rate.

8 Claims, 6 Drawing Sheets

| REQUEST NUMBER | TYPE: PRIORITY LEVEL | INTERVAL | DATA ITEM NAME |
|---|---|---|---|
| 1 | FIRST CLASS | SEQUENTIAL | SHOT EXPOSURE AMOUNT |

| REQUEST NUMBER | TYPE: PRIORITY LEVEL | INTERVAL | DATA ITEM NAME |
|---|---|---|---|
| 2 | FIRST CLASS | SEQUENTIAL | WAFER CORRECTION AMOUNT |

| REQUEST NUMBER | TYPE: PRIORITY LEVEL | INTERVAL | DATA ITEM NAME |
|---|---|---|---|
| 3 | 2 | 2008/4/1~2008/4/7 | WAFER CORRECTION AMOUNT |
| | | | WAFER POSITION |
| | | | TEMPERATURE |
| | | | ATMOSPHERIC PRESSURE |
| | | | ERROR EVENT |

| REQUEST NUMBER | TYPE: PRIORITY LEVEL | INTERVAL | DATA ITEM NAME |
|---|---|---|---|
| 4 | 1 | SEQUENTIAL | ERROR EVENT |

| REQUEST NUMBER | TYPE: PRIORITY LEVEL | INTERVAL | DATA ITEM NAME |
|---|---|---|---|
| 5 | 3 | 2008/3/1~2008/4/1 | ATMOSPHERIC PRESSURE |

| DATA ITEM NAME ~501 | DATA CONTENTS ~502 | OCCURRENCE GRANULARITY ~503 |
|---|---|---|
| WAFER POSITION | TIME/MEASUREMENT VALUE/JOB ID/WAFER NUMBER | WAFER UNIT |
| WAFER CORRECTION AMOUNT | TIME/CORRECTION VALUE/JOB ID/WAFER NUMBER | WAFER UNIT |
| SHOT EXPOSURE AMOUNT | TIME/MEASUREMENT VALUE/JOB ID/WAFER NUMBER/SHOT NUMBER | SHOT NUMBER |
| ERROR EVENT | TIME/ERROR CONTENT/JOB ID/WAFER NUMBER/SHOT NUMBER | SHOT NUMBER |
| ATMOSPHERIC PRESSURE | TIME/MEASUREMENT VALUE | 0.01Hz |
| TEMPERATURE | TIME/MEASUREMENT VALUE | 0.01Hz |
| ............ | | ............ |

F I G. 6

INFORMATION PROCESSING METHOD AND INFORMATION PROCESSING APPARATUS FOR TRANSMITTING DATA GENERATED BY DEVICE MANUFACTURING APPARATUS

BACKGROUND OF THE INVENTION

1. Field of the Invention

The present invention relates to an information processing apparatus which transmits, to at least one terminal, the data generated by a device manufacturing apparatus for manufacturing a device, an associated information processing method and an associated computer readable storage medium.

2. Description of the Related Art

There is available a system in which an information processing apparatus acquires the data generated by a device manufacturing apparatus for manufacturing a device and transmits the data to a terminal such as a host computer. Such a system can, for example, detect abnormality in a device manufacturing apparatus, observe the state of the apparatus, and analyze the cause of abnormality. An exposure apparatus which is used to manufacture micro-devices such as semiconductor devices can perform calibration to correct the positions of the units constituting the apparatus, alignment to align a reticle, on which a pattern is drawn, with a wafer, and the like.

Japanese Patent Laid-Open No. 2001-203247 discloses a system where an integrated information server to acquire and store the operation states of a plurality of exposure apparatus arranged in a clean room is placed outside the clean room.

In the above system, in response to a transmission request from a terminal such as a host computer, the data acquired by the information processing apparatus can be transmitted to the terminal. Assume that when the information processing apparatus has received many transmission requests, the apparatus has unconditionally accepted the many transmission requests. In this case, for example, a terminal which has transmitted a transmission request will keep waiting for the data corresponding to the transmission request assuming that it can immediately receive the data. In this case, in spite of the fact that the terminal or its user cannot analyze the received data and immediately feed back the analysis result to the device manufacturing apparatus, the terminal or its user will keep waiting for the data assuming that it is possible to receive and analyze the data.

SUMMARY OF THE INVENTION

The present invention provides a preferable technique for preventing a terminal side from keeping waiting for the arrival of data regardless that the terminal side cannot receive the data over a long period of time.

One of aspects of the present invention provides an information processing apparatus which transmits data generated by a device manufacturing apparatus for manufacturing a device to at least one terminal, the apparatus comprising: a communication unit configured to communicate with the at least one terminal; a transmission request processor configured to accept or reject a transmission request which the communication unit has received from the at least one terminal; and a transmission controller configured to control the communication unit to transmit, in response to a transmission request accepted by the transmission request processor, data corresponding to the transmission request to a terminal, of the at least one terminal, which has transmitted the transmission request, wherein when the communication unit receives a new transmission request from the at least one terminal, the transmission request processor accepts the new transmission request if a sum of transmission rates of the respective data concurrently transmitted from the communication unit in response to transmission requests which the transmission request processor has already accepted and a transmission rate at which data is transmitted in response to the new transmission request does not exceed a preset allowable transmission rate, and rejects the new transmission request if the sum of the transmission rates exceeds the allowable transmission rate, and a transmission rate of data transmitted from the communication unit is an amount of data transmitted per unit time from the communication unit.

Further features of the present invention will become apparent from the following description of exemplary embodiments with reference to the attached drawings.

DESCRIPTION OF THE EMBODIMENTS

The preferred embodiments of the present invention will be described below with reference to the accompanying drawings.

First Embodiment

Figure 2:
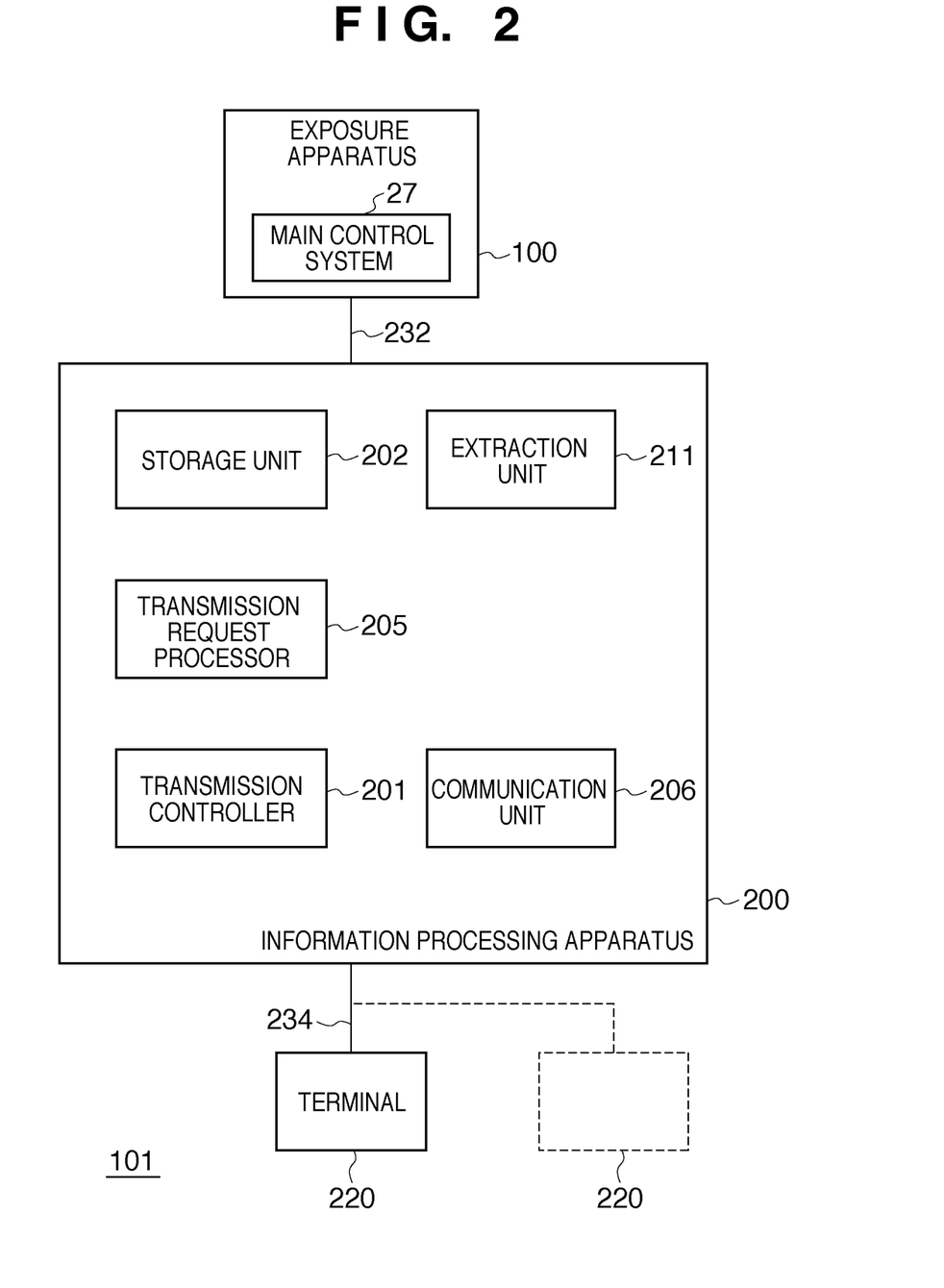
FIG. 2 is a block diagram showing the schematic arrangement of a device manufacturing system according to an embodiment of the present invention.

FIG. 2 is a block diagram showing the schematic arrangement of a device manufacturing system as an embodiment of the present invention. A device manufacturing system 101 includes one or a plurality of exposure apparatus 100 as one or a plurality of device manufacturing apparatus, an information processing apparatus 200, and one or a plurality of terminals 220. The exposure apparatus 100 is connected to the information processing apparatus 200 via a communication path (for example, a network such as a LAN) 232. The information processing apparatus 200 is connected to the terminal 220 via a communication path (for example, a network such as a LAN) 234. In this case, the exposure apparatus 100 is taken as an example of a device manufacturing apparatus. However, device manufacturing apparatus can be all types of apparatus for manufacturing devices (a resist coating apparatus, developing apparatus, inspection apparatus, deposition apparatus, etching apparatus, cleaning apparatus, asking apparatus, conveyance apparatus, and the like). Such devices can be all types of products that can be manufactured, for example, a semiconductor device, display device, magnetic device, and micromachine.

Figure 1:
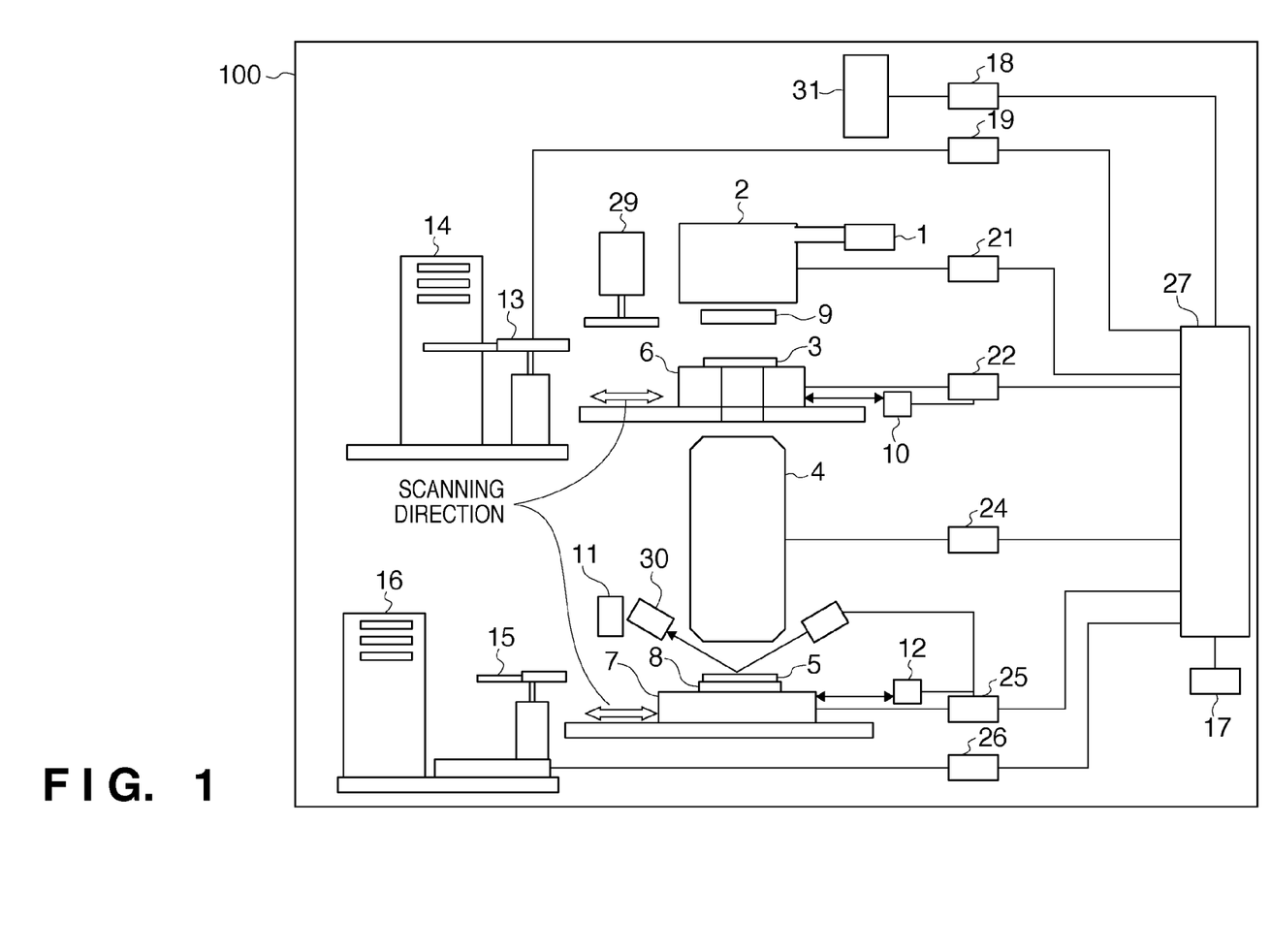
FIG. 1 is a view showing an example of the arrangement of an exposure apparatus as an example of a device manufacturing apparatus.

FIG. 1 is a view showing an example of the arrangement of the exposure apparatus 100 as an example of a device manufacturing apparatus. The exposure apparatus 100 is used in the exposure step in a lithography process. In this embodiment, the exposure apparatus 100 is configured as a scanning exposure apparatus. An illumination optical system 2 adjusts the shape and light amount distribution of the light beam provided from a light source 1. This light then illuminates a reticle (original) 3 held on a reticle stage 6. A projection optical system 4 projects a pattern on the reticle 3 onto a photosensitive material (resist) coated on a wafer (substrate) 5 held by a wafer chuck 8 on a wafer stage 7. This forms a latent pattern on the photosensitive material. This image pattern is transferred onto each of a plurality of shot areas arranged on the wafer. Each latent pattern is developed in the development step to form a mask pattern (resist pattern).

The illumination optical system 2 can include a plurality of aperture stops with different circular aperture areas for setting coherent factors σ. The illumination optical system 2 can also include a ring-shaped stop for annular illumination, a quadrupole stop, and a mechanism for adjusting an illumination light amount (for example, a plurality of ND filters and a mechanism of switching them). The illumination optical system 2 can further include a light amount detector to measure a light amount, a slit to determine the shape of a light beam, a blind placed at a position conjugate with the reticle 3 to secure an illumination range, and a driving mechanism to drive them. The operations of the light source 1 and illumination optical system 2 are controlled by instructions from a light source control system 21.

The projection optical system 4 can include a numerical aperture setting mechanism for setting a numerical aperture and a lens driving mechanism for correcting aberration. A projection optical control system 24 controls the operation of the projection optical system 4. A reticle stage measurement system 10 measures the position of the reticle stage 6 in two axial directions (that is, the X and Y directions) which are orthogonal to each other within a plane perpendicular to the optical axis and rotation around the axes. A reticle stage control system 22 controls the position and rotation of the reticle stage 6.

A TTR (Through The Reticle) observation optical system 9 is placed between the illumination optical system 2 and the reticle stage 6. The TTR observation optical system 9 can simultaneously observe and measure marks on the reticle 3, a reference mark on the reticle stage 6, and a stage reference mark on the wafer stage 7 via the projection optical system 4. This makes it possible to measure the positions of the reticle stage 6, reticle 3, and wafer stage 7 in the optical axis direction (that is, the Z direction) of the projection optical system 4 and two axial directions (that is, the X and Y directions) which are orthogonal to each other within a plane perpendicular to the optical axis, and rotations around the axes.

A wafer stage measurement system 12 and an alignment measurement system 30 can measure the position of the wafer 5. The wafer stage measurement system 12 measures, for example, the positions of the wafer 5 in the optical axis direction (that is, the Z direction) of the projection optical system 4 and two axial directions (that is, the X and Y directions) which are orthogonal to each other within a plane perpendicular to the optical axis, and rotations around the axes. The alignment measurement system 30 measures the surface position of the wafer 5 in the optical axis direction (the Z direction) of the projection optical system 4. A wafer stage control system 25 controls the position of the wafer stage 7 based on the information provided from the wafer stage measurement system 12 and alignment measurement system 30.

The exposure apparatus 100 also includes an off-axis observation optical system 11 which can observe and measure the surface of the wafer 5 without exposure light. The off-axis observation optical system 11 measures the positions of a plurality of marks formed on the wafer 5, and determines the position and shape of a pattern on the wafer 5 to allow a pattern on the reticle 3 to be superimposed and transferred on the pattern on the wafer 5. The off-axis observation optical system 11 also measures the position of a stage reference mark on the wafer stage 7.

To transfer all the patterns on the reticle 3 onto shot areas arranged on the wafer 5 with a slit-like illumination light beam, the reticle 3 held by the reticle stage 6 is driven in the scanning directions shown in FIG. 1. At the same time, the wafer 5 held by the wafer stage 7 is driven in the scanning directions shown in FIG. 1. In this case, the reticle 3 and the wafer 5 are driven at a speed ratio corresponding to the projection magnification of the projection optical system 4. If the relative positions of the reticle 3 and wafer 5 shift from each other, a deformed pattern is transferred onto a shot on the wafer 5. A main control system 27 therefore calculates the relative positions of the reticle 3 and wafer 5, and controls the reticle stage control system 22 and the wafer stage control system 25 to eliminate the relative positional shift.

The exposure apparatus 100 also includes a reticle conveyance unit including a reticle library 14 and a reticle robot 13, and a reticle alignment unit 29 which positions the reticle 3 on the reticle stage 6. The reticle conveyance unit operates in accordance with an instruction from a reticle conveyance control system 19. The exposure apparatus 100 also includes a wafer conveyance unit constituted by a wafer cassette elevator 16, a wafer loading/unloading robot 15, and the like. The wafer conveyance unit operates in accordance with an instruction from a wafer conveyance control system 26. A chamber environment controller 31 mainly performs adjustment of air temperature and air cleaning to filter fine foreign substances, thereby keeping the internal environment of the chamber of the exposure apparatus 100 constant. The chamber environment controller 31 operates in accordance with an instruction from a chamber control system 18.

The main control system 27 controls the constituent elements of the exposure apparatus 100, for example, the chamber control system 18, reticle conveyance control system 19, wafer conveyance control system 26, reticle stage control system 22, wafer stage control system 25, light source control system 21, and projection optical control system 24. The main control system 27 receives set parameters for defining the exposure operation of the exposure apparatus 100 or an operation instruction via a communication interface 17, and controls the respective constituent elements of the exposure apparatus 100 based on the parameters or operation instruction.

Exposure processing is executed in accordance with job parameters for defining the operation of the exposure apparatus 100. The job parameters include, for example, a process name (job name), lot ID, shot range, shot arrangement, each shot number, exposure amount, exposure scanning speed, exposure scanning direction, calibration items for the units constituting the exposure apparatus, and wafer and shot alignment scheme.

The exposure apparatus 100 generates data in various operations. In this embodiment, the main control system 27 is configured to output data recording the operation of the exposure apparatus 100 in exposure processing and other kinds of processing. The data includes set values such as the start and end times of the operation of each unit, a lot recognition ID/wafer number/shot number specifying a processing target, and job parameters for processing. The data can also include measurement values in calibration and alignment, an alignment result, an exposure control result, and a scanning operation control result. In addition, the data can include, for example, an error event which has occurred in the exposure apparatus 100 and the internal and external atmospheric pressures and temperatures of the exposure apparatus.

A further description of this embodiment will continue with reference to FIG. 2. The information processing apparatus 200 is configured to transmit the data generated by the exposure apparatus 100 as a device manufacturing apparatus to at least one of the terminals 220. The information processing apparatus 200 can include a communication unit 206, a transmission request processor 205, a transmission controller 201, an extraction unit 211, and a storage unit 202. The communication unit 206, transmission request processor 205, transmission controller 201, and extraction unit 211 can be implemented as hardware circuits. Alternatively, it is possible to incorporate software (programs) in the computer to make it function as the information processing apparatus 200 including the communication unit 206, transmission request processor 205, transmission controller 201, and extraction unit 211. For example, a computer readable storage medium can store the software (programs) incorporated in the computer.

The communication unit 206 communicates with at least one of the terminals 220 via a communication path 234. The transmission request processor 205 accepts or rejects the transmission request which the communication unit 206 has received from at least one of the terminals 220. When the communication unit 206 receives a new transmission request from at least one of the terminals 220, the transmission request processor 205 executes the following transmission request transmission. The transmission request processing is the processing of accepting the new transmission request if a total transmission rate does not exceed a preset allowable transmission rate, and otherwise rejecting the new transmission request. In this case, the total transmission rate is the sum of the transmission rates of the respective data concurrently transmitted from the communication unit 206 in response to the transmission requests which have already been accepted by the transmission request processor 205 and the transmission rate at which data is transmitted in response to the new transmission request. The transmission rate of data transmitted from the communication unit 206 is the amount of data transmitted per unit time from the communication unit 206. For example, this transmission rate can depend on the amount of transmission data provided per unit time from the extraction unit 211 to the communication unit 206. The allowable transmission rate may be the maximum transmission rate which the communication unit 206 or communication path 234 has or a lower rate. For example, the information processing apparatus 200 or the communication unit 206 can set an allowable transmission rate in advance. For example, the manager of the information processing apparatus 200 can arbitrarily make this setting.

In response to the transmission request accepted by the transmission request processor 205, the transmission controller 201 controls the communication unit 206 to transmit data corresponding to the transmission request to at least one of the terminals 220 which has transmitted the transmission request. The transmission request can contain data specifying information for specifying the data requested to be transmitted. The extraction unit 211 extracts the data specified by the data specifying information from the data generated by the exposure apparatus 100, and provides the extracted data to the communication unit 206 so as to transmit it to the terminal 220 as the transmission source of the transmission request. The communication unit 206 transmits the provided data to the terminal 220 as the transmission source.

The terminal 220 can detect abnormality in the exposure apparatus 100, observe the state of the exposure apparatus 100, and analyze the cause of the abnormality based on the data transmitted from the information processing apparatus 200. The terminal 220 can also analyze a problem in a process for each device, make process setting (APC: Advance Process Control), and provide information to the process next to the exposure process.

For example, regarding the detection of abnormality, the terminal 220 sequentially monitors outputs from the light amount measurement device of the illumination optical system 2, and can determine the occurrence of abnormality when a change in light amount exceeds a normal range. Adjusting the exposure apparatus 100 in accordance with the detection of such abnormality makes it possible to suppress the occurrence of defectives. In this case, the information processing apparatus 200 should quickly acquire and transmit the data measured by the exposure apparatus 100 to the terminal 220. Failures to acquire and transmit such data can lead to a large number of defectives. It is therefore necessary to preferentially transmit this data to the terminal 220.

It is possible to specify the cause of abnormality in the exposure apparatus 100 by analyzing outputs from various measurement devices, for example, components 9, 10, 11, 12, and 30 of the exposure apparatus 100 when the exposure apparatus 100 processes a lot in which the abnormality has been found in a device inspection process. In addition, analyzing outputs from the measurement devices over several days or weeks before the occurrence of abnormality can specify the period in which the abnormality has occurred. In this case, the information processing apparatus 200 needs to transmit enormous amount of data to the terminal 220 to analyze past data generated by the exposure apparatus 100. In an analysis requiring a long period of time to specify a cause, some delay is allowed in transmitting data to the terminal 220 unlike when it is possible to quickly cope with abnormality. That is, data are classified into data which should be preferentially transmitted to the terminal 220 and other data according to the application purposes of use of the data.

Figure 5:
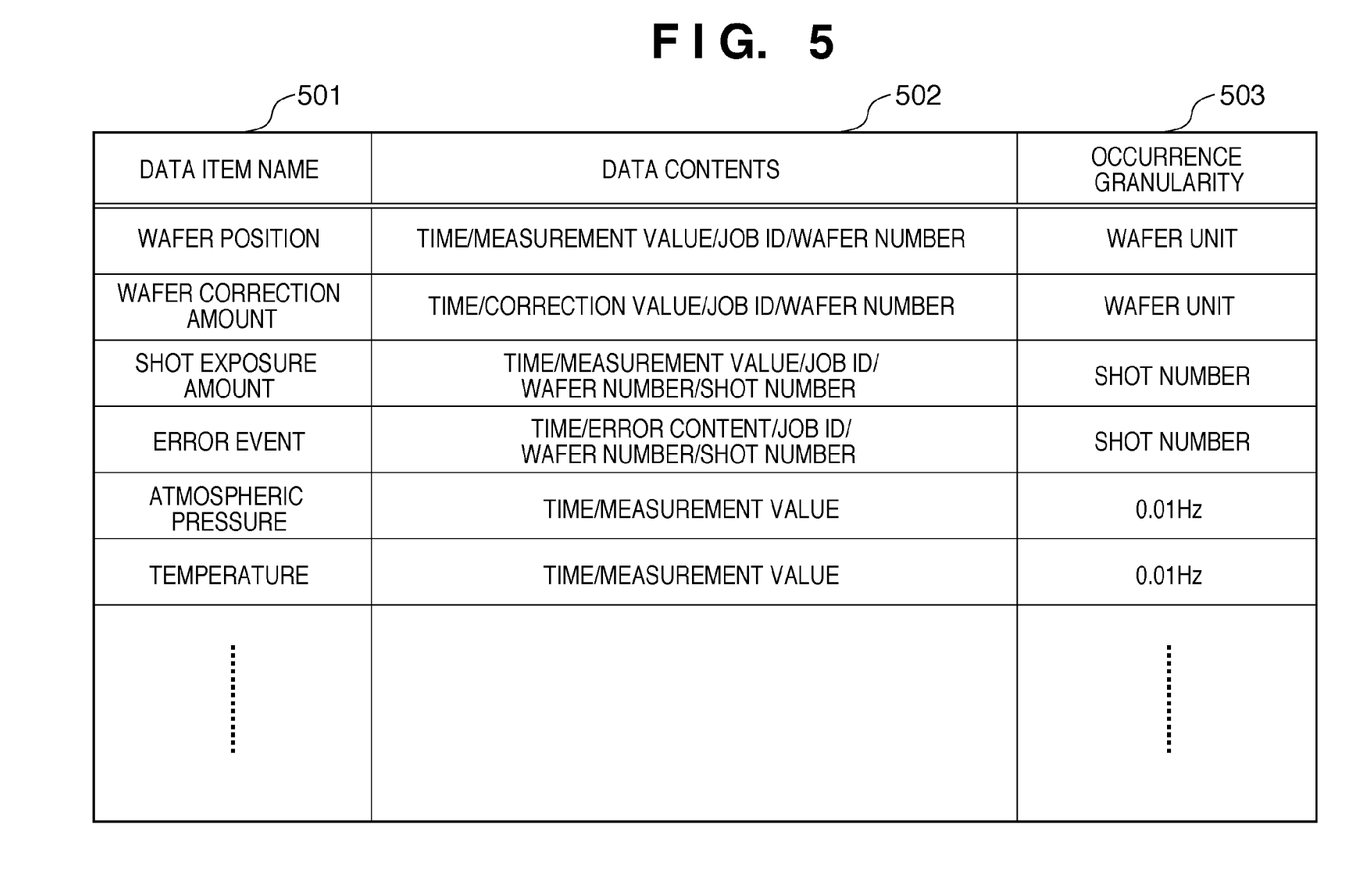
FIG. 5 is a view exemplifying apparatus data definitions provided by the information processing apparatus to a terminal.

The terminal 220 requests the information processing apparatus 200 to transmit the data generated by the exposure apparatus 100 to the terminal 220 with the application purpose of, for example, analyzing abnormality in a process or feeding back the analysis result to the exposure apparatus 100. An analysis of abnormality is performed by combining various measurement results, and hence can require data of a plurality of data items. The information processing apparatus 200 can present, to the terminal 220 via the communication path 232, apparatus data definitions indicating specific data of specific data items as data which can be transmitted to the terminal 220. The information processing apparatus 200 can present, to the terminal 220 in advance via the communication path 232, apparatus data definitions indicating specific data items of which data can be transmitted to the terminal 220. FIG. 5 exemplifies the apparatus data definitions provided to the terminal 220 by the information processing apparatus 200. The user of the terminal 220 can arbitrarily designate data items specifying data necessary for an analysis and request the information processing apparatus 200 to transmit the specified data to the terminal 220.

Figure 4:
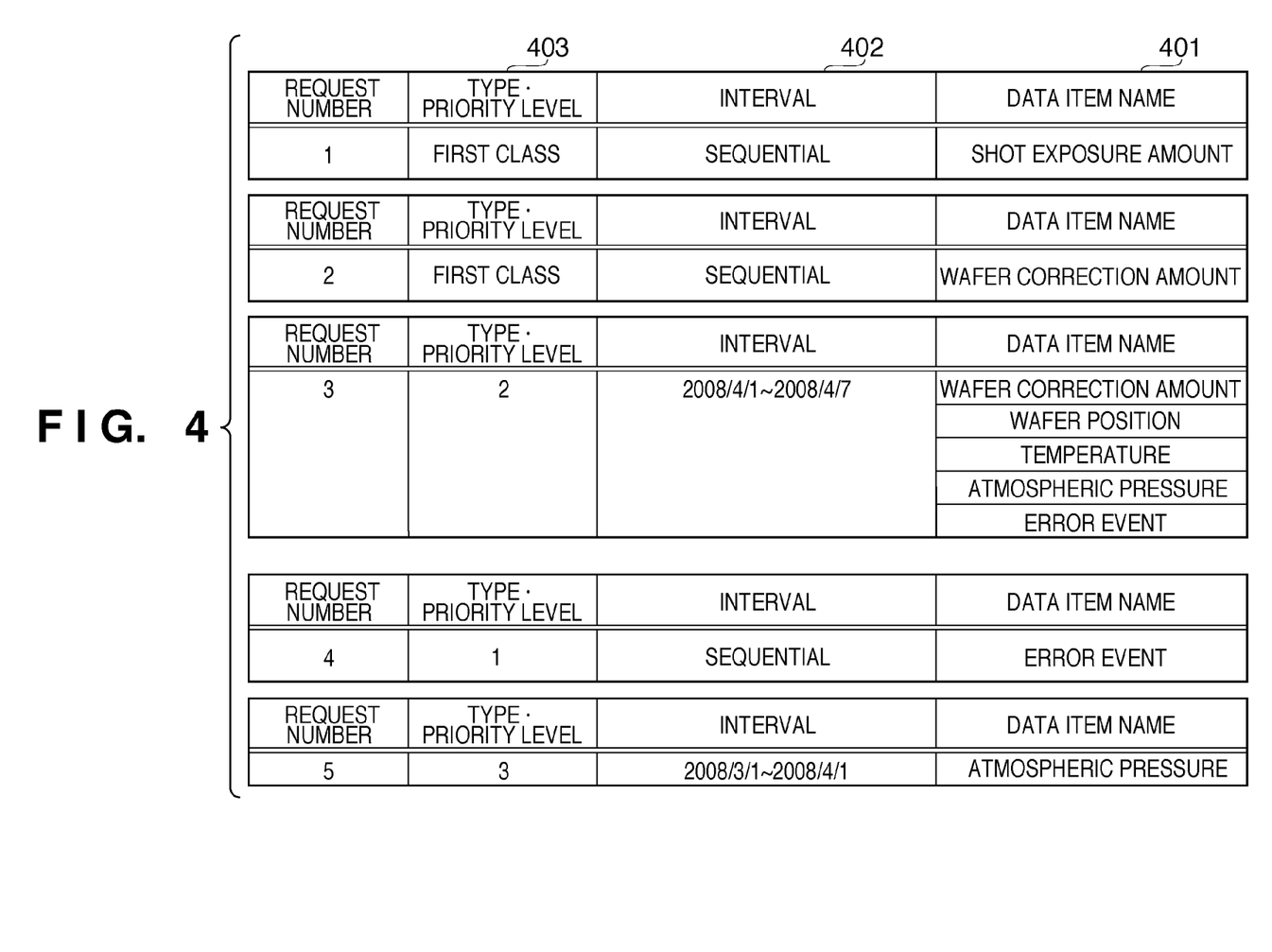
FIG. 4 is a view exemplifying information contained in a data transmission request.

FIG. 4 exemplifies the information contained in a data transmission request. The terminal 220 transmits a data transmission request to the information processing apparatus 200 via the communication path 234. FIG. 4 exemplifies five transmission requests. A transmission request can contain, as data specifying information, information 401 specifying data with a data item name and information 402 specifying data with the generation time of the data. The information 402 specifying data with the generation time of the data can contain information indicating data generated in an interval designated in the past or sequentially generated data. Referring to FIG. 4, the former information is exemplified as information indicating a designated interval (for example, 2008/4/1 to 2008/4/7), and the latter information is exemplified as "sequential". A transmission request can contain information 403 indicating the type and priority level of the request. As exemplified by FIG. 4, the data transmission request can contain a number (identifier) specifying the transmission request. One transmission request can contain a plurality of data items depending on the purpose of analysis.

The types of transmission requests can include a first-class transmission request and a second-class transmission request. In this case, the first-class transmission request can be a request to transmit data to be transmitted in response to the request, every time the data is prepared by the information processing apparatus 200, in preference to data corresponding to the second-class transmission request. The second-class transmission request can be a request that allows the transmission of data corresponding to the second-class transmission request to be temporarily suspended if the sum of the transmission rates of the respective data concurrently transmitted from the communication unit 206 exceeds an allowable transmission rate. The second-class transmission request can contain a priority level associated with the transmission of the data transmitted in response to the request. The information 403 indicates whether the transmission request is a first-class transmission request, and a priority level if the transmission request is a second-class transmission request. Referring to FIG. 4, "first class" indicates that the transmission request is a first-class transmission request, and "1", "2", or "3" indicate that the transmission request is a second-class transmission request and its priority level. In this embodiment, smaller numbers indicate higher priority levels.

Figure 3:
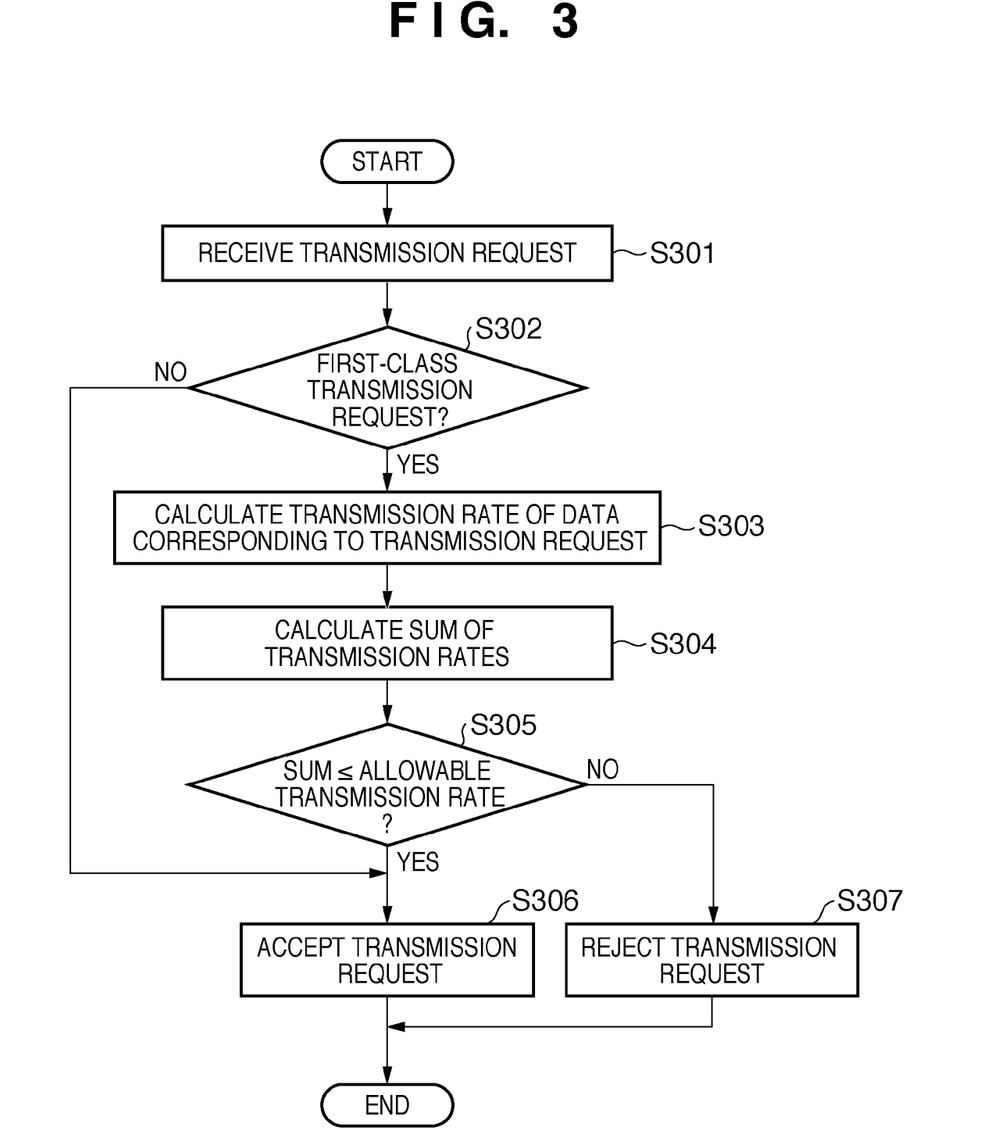
FIG. 3 is a flowchart exemplifying transmission request processing in an information processing apparatus.

FIG. 3 is a flowchart exemplifying transmission request processing in the information processing apparatus 200. In step S301, the communication unit 206 receives a transmission request from the terminal 220 via the communication path 234, and the transmission controller 201 can recognize from the notification from the communication unit 206 that the communication unit 206 has received the transmission request. In step S302, the transmission request processor 205 refers to the information 403 contained in the transmission request received by the communication unit 206 to determine whether the transmission request is a first-class transmission request or a second-class transmission. If the transmission request processor 205 determines that the transmission request is a first-class transmission request, the process advances to step S303. If the transmission request is a second-class transmission request, the process advances to step S306. In step S306, the transmission request is accepted. In this embodiment, therefore, if the transmission request is a second-class transmission request, the transmission request is accepted in step S306 unconditionally or regardless of the total transmission rate (to be described later).

A first-class transmission request is, for example, a transmission request which is useful when the data generated by the exposure apparatus 100 should be transmitted quickly and reliably to the terminal 220 which has requested it. Assume that the terminal 220 has analyzed the data generated by the exposure apparatus 100 and has determined that the analysis result should be immediately fed back to the exposure apparatus 100. In this case, the terminal 220 needs to transmit a first-class transmission request as a transmission request to the information processing apparatus 200. With this operation, if the total transmission rate does not exceed an allowable transmission rate, the terminal 220 can immediately and reliably receive the data generated by the exposure apparatus 100 and prepared in the information processing apparatus 200.

If the total transmission rate exceeds the allowable transmission rate, it is impossible to immediately and reliably transmit the data corresponding to the first-class request to the terminal 220. In this case, regardless that the terminal 220 or its user cannot analyze received data or immediately feed back the analysis result to the exposure apparatus 100, the terminal or its user keeps waiting for the arrival of the data assuming that the terminal or its user can do the above operation. In this case, therefore, if the total transmission rate exceeds the allowable transmission rate, the transmission request processor 205 rejects a first-class information request. This allows the terminal 220 or its user to recognize that it is impossible to obtain data for analysis immediately after it is generated. A total transmission rate will be described again below. A total transmission rate is the sum $(rb+ra1+ra2+ra3+ \ldots +rn)$ of the respective transmission rates (for example, ra1, ra2, ra3, . . . , and rn) of the respective data concurrently transmitted from the communication unit 206 in response to the transmission requests which have already been accepted by the transmission request processor 205 and the transmission rate (for example, rb) at which data is transmitted in response to the new transmission request.

In step S303, the transmission request processor 205 calculates the data transmission rate rb, which is the amount of data transmitted per unit time to the terminal 220 as a transmission request source in response to the new transmission request received by the communication unit 206 in step S301. In step S304, the transmission request processor 205 calculates the transmission rates (ra1, ra2, ra3, . . . , and rn) of the respective data concurrently transmitted from the communication unit 206 in response to the transmission requests which have already been accepted by the transmission request processor 205.

In step S305, the transmission request processor 205 calculates a total transmission rate $(rb+ra1+ra2+ra3+ \ldots +rn)$, and determines whether the total transmission rate exceeds a preset allowable transmission rate. If the total transmission rate does not exceed the preset allowable transmission rate, the transmission request processor 205 accepts a transmission request (a first-class transmission request in this case) in step S306. Upon accepting the transmission request, the transmission request processor 205 can notify the terminal 220 which has issued the transmission request of the corresponding information via the communication unit 206. If the total transmission rate exceeds the preset allowable transmission rate, the transmission request processor 205 rejects the transmission request (a first-class transmission request in this case) in step S307. Upon rejecting the transmission request, the transmission request processor 205 notifies the terminal 220 which has issued the transmission request of the corresponding information via the communication unit 206.

The transmission request processor 205 may notify the terminal 220, as the transmission source of the transmission request, of, for example, the transmission rate of the data which is calculated in step S303. Such a notification allows the terminal 220 to transmit, when the transmission request is rejected, a transmission request to request data transmission at a lower transmission rate, instead of the rejected transmission request, to the information processing apparatus 200.

In calculating a transmission rate in steps S303 and S304, the transmission request processor 205 can set the amount of data corresponding to the transmission request, which is generated per unit time by the exposure apparatus (device manufacturing apparatus) 100 as the transmission rate of the data.

In this case, it is possible to express a transmission rate as the number of reports generated per unit time. A report is a set of pieces of information associated with one event occurring in the exposure apparatus (device manufacturing apparatus) 100. An event is specified by a data item name 501, and can occur per, for example, wafer or shot. The contents of a set of pieces of information associated with one event are specified by data contents 502, and can contain the time when processing associated with the event has occurred, a shot number specifying a shot, and a measurement value as a processing result. It is possible to predict the number of reports generated per unit time by the exposure apparatus 100 and to calculate the number of reports for, for example, each data item name 501, based on an occurrence granularity 503. For example, the occurrence granularity for data such as a wafer position measured for each wafer and the occurrence granularity for data such as shot light exposure amount measured for each shot can be set as wafer unit and shot unit, respectively. The transmission request processor 205 can calculate the number of reports per unit time based on the number of wafers or shots for which the exposure apparatus 100 can perform exposure processing per unit time. The transmission request processor 205 can determine the throughputs of wafers and shots in the exposure apparatus 100 based on the specifications of the exposure apparatus 100, the recipe for exposure processing, the operation performance, and the like. In addition, temperatures, atmospheric pressures, and the like are periodically measured in a cycle set in the exposure apparatus 100, and hence it is possible to calculate the number of reports per unit time from the cycle. Alternatively, a transmission rate may be expressed by the number of bytes of data transmitted per unit time.

The transmission request processor 205 may use transmission rate information contained in a transmission request instead of calculating the transmission rate of data corresponding to the transmission request in step S303. In this case, the transmission request processor 205 can set, as a transmission rate, the amount of data corresponding to a transmission request which the exposure apparatus (device manufacturing apparatus) 100 generates per unit time. The calculation for this operation can follow the above case.

Figure 6:
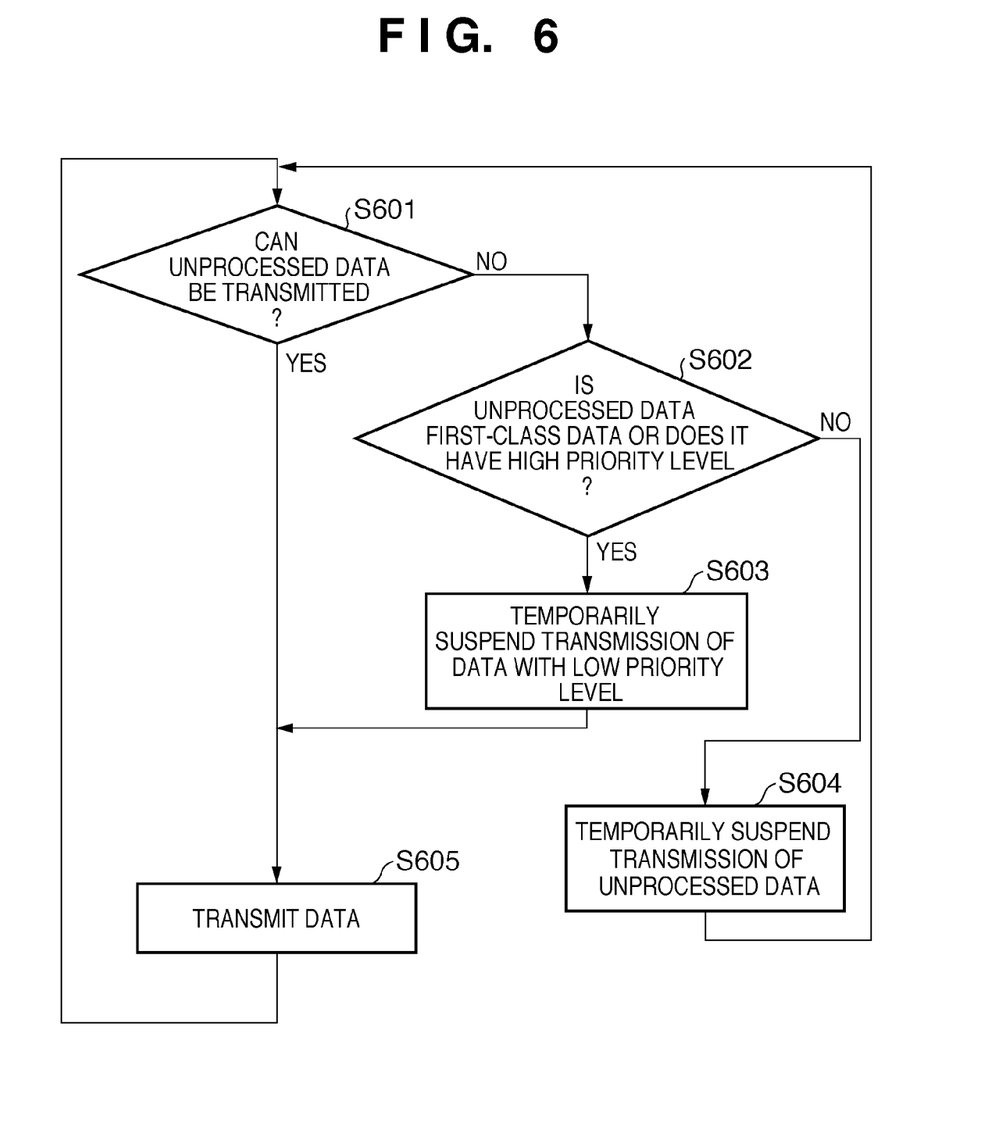
FIG. 6 is a flowchart exemplifying transmission control processing in the information processing apparatus.

FIG. 6 is a flowchart exemplifying transmission control processing in the information processing apparatus 200. The data generated by the exposure apparatus 100 is transmitted to the information processing apparatus 200 via the communication path 232 and stored in the storage unit 202.

In step S601, the transmission controller 201 determines whether it is possible to transmit data corresponding to a transmission request, of transmission requests, in response to which the transmission of data has not been completed (to be referred to as unprocessed data hereinafter). In this case, if the sum of the transmission rates of the unprocessed data and data currently transmitted does not exceed an allowable transmission rate, the transmission controller 201 determines that it is possible to transmit the unprocessed data. If it is possible to transmit the unprocessed data, the transmission controller 201 causes the communication unit 206 to transmit the unprocessed data to the terminal 220 as the transmission source of the transmission request in step S605. If it is not possible to transmit the unprocessed data, the transmission controller 201 causes the process to advance to step S602.

In step S602, the transmission controller 201 determines whether the unprocessed data is data corresponding to a first-class transmission request or data corresponding to a transmission request higher in priority level than currently transmitted data. In this case, as described above, a higher priority level is assigned to the transmission of data corresponding to a first-class transmission request than to data corresponding to a second-class transmission request. That is, a first-class transmission request is higher in priority level than a second-class transmission request. In addition, priority levels are assigned to second-class transmission requests, as exemplified by FIG. 4. If the unprocessed data is data corresponding to the first-class transmission request or data corresponding to a transmission request higher in priority level than currently transmitted data, the transmission controller 201 advances the process to step S603, and otherwise to step S604.

In step S603, the transmission controller 201 temporarily suspends the transmission of data lower in priority level than the unprocessed data (all of such data are data corresponding to second-class transmission requests). Thereafter, the transmission controller 201 causes the communication unit 206 to transmit the unprocessed data to the terminal 220 as the transmission source of the transmission request in step S605 by using the time margin produced by the suspension of the transmission. In this case, the transmission controller 201 can notify the terminal 220 via the communication unit 206, which has issued the request to transmit data (corresponding to a second-class transmission request) whose transmission is suspended, that the transmission of the data is temporarily suspended. That is, the transmission controller 201 can notify the terminal 220, which has transmitted the second-class transmission request, of this information via the communication unit 206.

In step S604, the transmission controller 201 temporarily suspends the transmission of the unprocessed data, and returns the process to step S602. In this case, the transmission controller 201 can notify the terminal 220 via the communication unit 206, which has issued the transmission request for the unprocessed data, that the transmission of the unprocessed data is temporarily suspended.

With the processing performed by the transmission controller 201 in steps S602 to S604, data corresponding to a plurality of second-class transmission requests accepted by the transmission request processor 205 are transmitted in descending order of priority levels. In addition, the transmission controller 201 transmits data corresponding to a first-class transmission request in preference to data corresponding to a second-class transmission request.

[Supplementary Explanation]

It is possible to control the transmission rate of data from the communication unit 206 of the information processing apparatus 200 to the terminal 220 by directly controlling the communication unit 206 or controlling the extraction speed of data by the extraction unit 211. Controlling the extraction speed of data by the extraction unit 211 can control the amount of data provided per unit time from the extraction unit 211 to the communication unit 206. This makes it possible to indirectly control the transmission rate of data by the communication unit 206.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-180053, filed Jul. 31, 2009, which is hereby incorporated by reference herein in its entirety.

What is claimed is:

1. An information processing apparatus which transmits data generated by a device manufacturing apparatus for manufacturing a device to at least one terminal, the apparatus comprising:

a communication unit configured to communicate with the at least one terminal;

a transmission request processor configured to accept or reject a transmission request which has been received from the at least one terminal by the communication unit, the transmission request including, as types of transmission requests, a first-class transmission request and a second-class transmission request, the first-class transmission request being a request to transmit, every time data to be transmitted in response to the first-class transmission request is prepared in the information processing apparatus, the data in preference to data corresponding to the second-class information request, the second-class transmission request allowing transmission of data corresponding to the second-class transmission request to be temporarily suspended; and a transmission controller configured to control the communication unit to transmit, in response to a transmission request accepted by the transmission request processor, data corresponding to the transmission request to a terminal, of the at least one terminal, which has transmitted the transmission request, wherein when the communication unit receives a new first-class transmission request from the at least one terminal, the transmission request processor accepts the new first-class transmission request if a sum of transmission rates of the respective data concurrently transmitted from the communication unit in response to transmission requests which has been already accepted by the transmission request processor and a transmission rate at which data is transmitted in response to the new first-class transmission request does not exceed the allowable transmission rate, and rejects the new first-class transmission request if the sum of the transmission rates exceeds the allowable transmission rate, wherein when the communication unit receives a new second-class transmission request from the at least one terminal, the transmission request processor accepts the new second-class transmission request regardless of transmission rates of the respective data concurrently transmitted from the communication unit in response to transmission requests which has been already accepted by the transmission request processor and a transmission rate at which data is transmitted in response to the new second-class transmission request, and wherein a transmission rate of data transmitted from the communication unit is an amount of data transmitted per unit time from the communication unit.

2. The apparatus according to claim 1, wherein the second-class transmission request contains a priority level associated with transmission of data corresponding to the second-class transmission request, wherein the transmission controller performs control to transmit data corresponding to a first-class transmission request in preference to data corresponding to a second-class transmission request, and wherein the transmission controller performs control to transmit data corresponding to a plurality of second-class transmission requests accepted by the transmission request processor in descending order of priority levels.

3. The apparatus according to claim 1, wherein when transmission of data corresponding to a second-class transmission request is delayed to preferentially transmit data corresponding to a first-class transmission request or another second-class transmission request, the transmission controller notifies a terminal which has transmitted the second-class transmission request, via the communication unit, that the transmission of the data corresponding to the second-class transmission request is delayed.

4. The apparatus according to claim 1, wherein the transmission controller notifies a terminal which has transmitted a transmission request, via the communication unit, of a transmission rate of data to be transmitted in response to the transmission request.

5. The apparatus according to claim 1, wherein the transmission request processor uses an amount of data corresponding to the transmission request which is generated per unit time by the device manufacturing apparatus as a transmission rate of the data corresponding to the transmission request.

6. The apparatus according to claim 1, wherein the transmission request processor uses, as a transmission rate of data corresponding to a transmission request, transmission rate information contained in the transmission request.

7. An information processing method in an information processing apparatus which transmits data generated by a device manufacturing apparatus for manufacturing a device to at least one terminal, the method comprising the steps of:

accepting or rejecting a transmission request from the at least one terminal, the transmission request including, as types of transmission requests, a first-class transmission request and a second-class transmission request, the first-class transmission request being a request to transmit, every time data to be transmitted in response to the first-class transmission request is prepared in the information processing apparatus, the data in preference to data corresponding to the second-class information request, the second-class transmission request allowing transmission of data corresponding to the second-class transmission request to be temporarily suspended; and transmitting from the information processing apparatus, in response to a transmission request accepted in the transmission request processing step, data corresponding to the transmission request to a terminal, of the at least one terminal, which has transmitted the transmission request, wherein in the accepting or rejecting step, when a new first-class transmission request is received from the at least one terminal, the new first-class transmission request is accepted if a sum of transmission rates of the respective data concurrently transmitted from the information processing apparatus in response to transmission requests which have already been accepted in the transmission request processing step and a transmission rate at which data is transmitted in response to the new first-class transmission request does not exceed the allowable transmission rate, and the new first-class transmission request is rejected if the sum of the transmission rates exceeds the allowable transmission rate, wherein in the accepting or rejecting step, when a new second-class transmission request is received from the at least one terminal, the new second-class transmission request is accepted regardless of transmission rates of the respective data concurrently transmitted from the information processing apparatus in response to transmission requests which has been already accepted in the transmission request processing step and a transmission rate at which data is transmitted in response to the new second-class transmission request, and wherein a transmission rate of data transmitted from the information processing apparatus is an amount of data transmitted per unit time from the information processing apparatus.

8. A non-transitory computer readable storage medium storing a program for causing a computer to function as an information processing apparatus which transmits data generated by a device manufacturing apparatus for manufacturing a device to at least one terminal, the program causing the computer to function as an information processing apparatus comprising:
- a communication unit which communicates with the at least one terminal,
- a transmission request processor which accepts or rejects a transmission request which has been received from the at least one terminal by the transmission request processor, the transmission request including, as types of transmission requests, a first-class transmission request and a second-class transmission request, the first-class transmission request being a request to transmit, every time data to be transmitted in response to the first-class transmission request is prepared in the information processing apparatus, the data in preference to data corresponding to the second-class information request, the second-class transmission request allowing transmission of data corresponding to the second-class transmission request to be temporarily suspended, and
- a transmission controller which controls the communication unit to transmit, in response to a transmission request accepted by the transmission request processor, data corresponding to the transmission request to a terminal, of the at least one terminal, which has transmitted the transmission request,
- wherein when the communication unit receives a new first-class transmission request from the at least one terminal, the transmission request processor accepts the new first-class transmission request if a sum of transmission rates of the respective data concurrently transmitted from the communication unit in response to transmission requests which has been already accepted by the transmission request processor and a transmission rate at which data is transmitted in response to the new first-class transmission request does not exceed the allowable transmission rate, and rejects the new first-class transmission request if the sum of the transmission rates exceeds the allowable transmission rate,
- wherein when the communication unit receives a new second-class transmission request from the at least one terminal, the transmission request processor accepts the new second-class transmission request regardless of transmission rates of the respective data concurrently transmitted from the communication unit in response to transmission requests which has been already accepted by the transmission request processor and a transmission rate at which data is transmitted in response to the new second-class transmission request, and
- wherein a transmission rate of data transmitted from the communication unit is an amount of data transmitted per unit time from the communication unit.

* * * * *